United States Patent
Lee et al.

(10) Patent No.: US 9,035,285 B2
(45) Date of Patent: May 19, 2015

(54) DISPLAY DEVICE AND ORGANIC LIGHT EMITTING DIODE DISPLAY

(75) Inventors: Jung-Min Lee, Yongin (KR);
Choong-Ho Lee, Yongin (KR); Kie Hyun Nam, Yongin (KR)

(73) Assignee: Samsung Display Co., Ltd. (KR)

( * ) Notice: Subject to any disclaimer, the term of this patent is extended or adjusted under 35 U.S.C. 154(b) by 929 days.

(21) Appl. No.: 13/069,254

(22) Filed: Mar. 22, 2011

(65) Prior Publication Data
US 2012/0104420 A1   May 3, 2012

(30) Foreign Application Priority Data
Nov. 1, 2010   (KR) .................. 10-2010-0107708

(51) Int. Cl.
| H01L 51/52 | (2006.01) |
| H01L 27/32 | (2006.01) |
| H01L 51/00 | (2006.01) |
| B82Y 10/00 | (2011.01) |

(52) U.S. Cl.
CPC ........ *H01L 51/5246* (2013.01); *H01L 27/3276* (2013.01); *H01L 51/0048* (2013.01); *H01L 51/5243* (2013.01); *H01L 51/525* (2013.01); *B82Y 10/00* (2013.01)

(58) Field of Classification Search
CPC ............ H01L 27/3276; H01L 51/0048; H01L 51/5246; H01L 51/525; H01L 51/5243; B82Y 10/00
See application file for complete search history.

(56) References Cited

U.S. PATENT DOCUMENTS

| 6,998,776 | B2 | 2/2006 | Aitken et al. |
| 7,537,504 | B2 | 5/2009 | Becken et al. |
| 2012/0075261 | A1* | 3/2012 | Ryu et al. ............... 345/204 |
| 2012/0091484 | A1* | 4/2012 | Lee et al. ............... 257/91 |

FOREIGN PATENT DOCUMENTS

| JP | 2003-272830 | 9/2003 |
| JP | 2007-141803 | 6/2007 |
| KR | 102008008803 | 10/2008 |

* cited by examiner

*Primary Examiner* — Hrayr A Sayadian
(74) *Attorney, Agent, or Firm* — Knobbe Martens Olson & Bear LLP

(57) ABSTRACT

A display device includes a substrate, a display unit formed on the substrate, a sealing substrate bonded to the substrate by a bonding layer surrounding the display unit, the sealing substrate comprising a complex member and an insulating member, wherein the complex member has a resin matrix and a plurality of carbon fibers and the insulator is connected to an edge of the complex member and comprises a penetration hole, a metal layer disposed at one side of the sealing substrate wherein the one side faces the substrate, and a conductive connection unit filling in the penetration hole and contacting the metal layer. The complex member and the insulator may be coupled by tongue and groovecoupling along a thickness direction of the sealing substrate where the protrusion-groove coupling structure is top-to-bottom symmetric and the insulator may have a thickness identical to that of the complex member.

8 Claims, 16 Drawing Sheets

FIG. 6

DISPLAY DEVICE AND ORGANIC LIGHT EMITTING DIODE DISPLAY

CROSS-REFERENCE TO RELATED APPLICATIONS

This application claims priority to and the benefit of Korean Patent Application No. 10-2010-0107708 filed in the Korean Intellectual Property Office on Nov. 1, 2010, the entire contents of which are incorporated herein by reference.

BACKGROUND

1. Field

The present disclosure relates a display device. More particularly, the described technology relates to an organic light emitting diode (OLED) display and a sealing substrate for sealing a display unit.

2. Description of the Related Technology

Among various display devices, an organic light emitting diode (OLED) display is a flat panel, self light emitting display device.

An organic light emitting diode (OLED) display displays an image through the organic light emitting elements. A display unit typically includes a plurality of organic light emitting elements. If such a display unit is exposed to moisture and oxygen, the performance thereof becomes deteriorated. Accordingly, it is desired to protect the display device using a technology for suppressing the penetration of moisture and oxygen by sealing the display unit.

The above information disclosed in this Background section is only for enhancement of understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide an organic light emitting diode (OLED) display having advantages of improving a sealing function of a display unit.

One aspect provides a display device including a substrate, a display unit formed on the substratem, a sealing substrate bonded to the substrate by a bonding layer surrounding the display unit, the sealing substrate including a complex member and an insulating member, wherein the complex member has a resin matrix and a plurality of carbon fibers and the insulator is connected to an edge of the complex member and includes a penetration hole, a metal layer disposed at one side of the sealing substrate wherein the one side faces the substrate, and a conductive connection unit filling in the penetration hole and contacting the metal layer. The complex member and the insulator are coupled by tongue and groove coupling along a thickness direction of the sealing substrate where the tongue and groove are top-to-bottom symmetric and the insulator has a thickness identical to that of the complex member.

The complex member may include a first, second, third and fourth complex layers, the first and fourth complex layers having a first width, and the second and third complex layers having a second width different from the first width. Each one of the first complex layer to the fourth complex layer may includes a resin matrix and a plurality of carbon fibers.

The plurality of carbon fibers may be weaved to cross each other and have a single arrangement direction in each of the first through fourth complex layers. Carbon fibers of the first complex layer and carbon fibers of the fourth complex layer may be arranged in a first direction, and carbon fibers of the second complex layer and carbon fibers of the third complex layer may be arranged in a second direction that crosses the first direction.

The insulation member may include a first, second, third and fourth insulation layers, the first and fourth insulation layers having a first width, and the second and third insulation layers having a second width different from the first width. Each one of the first insulation layer to the fourth insulation layer may includes a resin matrix and a plurality of reinforcing fibers.

The plurality of reinforcing fibers may be weaved to cross each other and have a single arrangement direction in each of the first through fourth insulation layers. Reinforcing fibers of the first insulation layer and reinforcing fibers of the fourth insulation layer may be arranged in a first direction, and reinforcing fibers of the second insulation layer and reinforcing fibers of the third insulation layer may be arranged in a second direction that crosses the first direction.

The insulator may be made of at least one of plastic, glass, and reinforcing fiber composite material. The reinforcing fiber may include at least one of glass fiber and aramid fiber.

Another aspect provides an organic light emitting diode (OLED) display including a substrate, a display unit formed on the substrate and including a common power line and a common electrode, a sealing substrate bonded to the substrate by a bonding layer surrounding the display unit and including a complex member and an insulator, wherein the complex member includes a resin matrix and a plurality of carbon fibers and the insulator is connected to the complex member and includes a first penetration hole and a second penetration hole, a first conducting unit formed over an inner side and an outer side of the sealing substrate through the first penetration hole and configured to supply a first electric signal to the common line, and a second conducting unit formed over an inner side and an outer side of the sealing substrate through the second penetration hole and configured to supply a second electric signal to the common electrode. The complex member and the insulator may be coupled by tongue and groove coupling along a thickness direction of the sealing substrate where the tongue and groove are top-to-bottom symmetric, and the insulator may have a thickness identical to that of the complex member.

The OLED display may further include a pad unit disposed at an outer side of the display unit and including a first pad unit electrically connected to the common power line and a second pad unit electrically connected to the common electrode, and a connective bonding layer disposed between the first pad unit and the first conducting unit and between the second pad unit and the second conducting unit.

The common power line may include a first common line and a second common power line crossing each other, and the first pad unit and the second pad unit may be alternately and repeatedly disposed along one direction of the substrate. The conductive bonding layer may be conductive in a thickness direction and may be insulating in the other directions except the thickness direction.

The OLED display may further include a first pad unit disposed at an outer side the display unit and electrically connected to the common power line and a conductive bonding layer disposed between the first pad unit and the first conducting unit, and the second conducting unit closely contacting the common electrode.

The OLED display may further include a plurality of spacers below the common electrode in the display unit. The common electrode may form a protrusion portion corresponding to the spacer.

The first conducting unit may include a first inner layer formed on an inner side of the insulator, a first connecting unit filling in the first penetration hole, and a first outer layer formed on an outer side of the insulator. The second conducting unit may include a second inner layer formed over an inner side of the insulator and an inner layer of the complex member, a second connection unit filling in the second penetration hole, and a second outer layer formed on an outer side of the insulator.

The second inner layer may contact the bonding layer and face the display unit. The first inner layer may be disposed at an outer side of the second inner layer at a predetermined distance from the second inner layer. The second inner layer may be formed as a metal foil including aluminum or copper.

In the organic light emitting diode (OLED) display according to certain embodiments, a sealing function of the display unit is improved, a large display area of the display unit is realized, luminance uniformity is improved, and the number of parts is reduced. Therefore, an entire structure and a manufacturing process of the organic light emitting diode (OLED) display are simplified. Further, a sealing substrate is prevented from bending in a process of manufacturing a sealing substrate.

BRIEF DESCRIPTION OF THE DRAWINGS

FIG. 6 to FIG. 8 are partial enlarged cross-sectional views of an embodiment of an organic light emitting diode (OLED) display.

DETAILED DESCRIPTION OF CERTAIN INVENTIVE EMBODIMENTS

Figure 1:
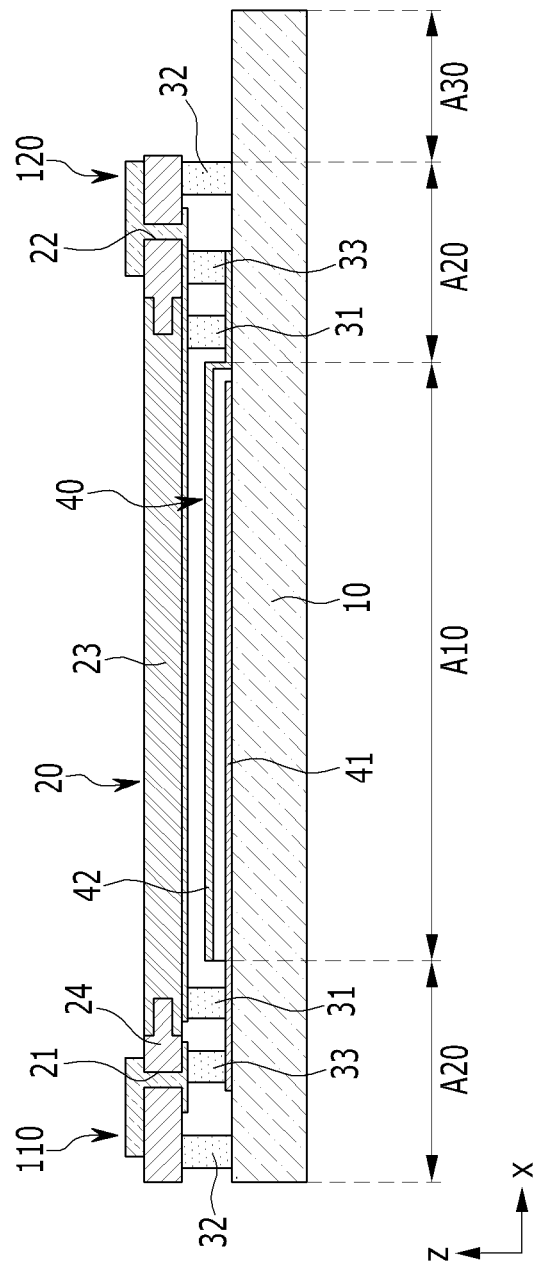
FIG. 1 is a cross-section view illustrating an embodiment of an organic light emitting diode (OLED) display.

Hereinafter, the present invention will be described more fully with reference to the accompanying drawings, in which certain embodiments of the invention are shown. As those skilled in the art would realize, the described embodiments may be modified in various ways, without departing from the spirit or scope of the present invention.

The drawings and description are to be regarded as illustrative in nature and not restrictive. Like reference numerals generally designate like elements throughout the specification. Sizes and thicknesses of each element are approximately shown for better understanding and ease of description.

It will be understood that when an element such as a layer, film, region, or substrate is referred to as being "on" another element, it can be directly on the other element or intervening elements may also be present.

FIG. 1 is a cross-section view schematically illustrating an embodiment of an organic light emitting diode (OLED) display.

Referring to FIG. 1, an embodiment of the OLED display 100 includes a substrate 10, a display unit 40 formed on the substrate 10, and a sealing substrate 20 bonded to the substrate 10 by bonding layers 31 and 32 which surround the display unit 40. The substrate 10 includes a display area A10 including the display unit 40, and a non-display area on the outer sides of the display area A10, including a wire and sealing area A20, and a pad area A30.

The display unit 40 includes a plurality of pixels, and each pixel can include an organic light emitting element and a driving circuit. The organic light emitting element can include a pixel electrode, an organic emission layer, and a common electrode 42. The driving circuit can be formed of at least two thin film transistors and at least one capacitor. The thin film transistors can include a switching thin film transistor and a driving thin film transistor.

Each pixel can include a gate line, a data line, and a common power line 41. The gate line transfers a scan signal, and the data line transfers a data signal. The common power line 41 applies a common voltage to the driving thin film transistor. The common power line 41 may include a first common power line parallel to the data line and a second common power line parallel to the gate line.

The structure of the display unit 40 is described in further detail below. In FIG. 1, the display unit 40 including the common power line 41 and the common electrode 42 is schematically illustrated.

The bonding layers 31 and 32 include a first bonding layer 31 surrounding the display unit 40 and a second bonding layer 32 surrounding the first bonding layer 31 at the outer side of the first bonding layer 31. A conductive bonding layer 33 is disposed between the first bonding layer 31 and the second bonding layer 32. The first bonding layer 31 and the second bonding layer 32 do not include conducting material. The first bonding layer 31 and the second bonding layer 32 may include thermosetting resin, such as epoxy resin, for example. In some embodiments, moisture absorption filling (not shown) may be disposed inside the first bonding layer 31 between the substrate 10 and the sealing substrate 20.

In the organic light emitting diode (OLED) display 100, the common power line 41 and the common electrode 42 are not connected to a flexible printed circuit (not shown) attached at a pad area A30. Instead, the common power line 41 is connected to a first conducting unit 110 provided at the sealing substrate 20, and receives an electric signal from the first conducting unit 110. The common electrode 42 is connected to a second conducting unit 120 provided at the sealing substrate 20, and receives an electric signal from the second conducting unit 120.

Accordingly, the organic light emitting diode (OLED) display 100 may uniformly supply an electric signal to the common power line 41 and the common electrode 42 without forming a pad area A40 at four edges of a display unit 40, which may have a large area. As a result, the entire structure of the organic light emitting diode (OLED) display 100 and the manufacturing process thereof can be simplified while preventing non-uniform luminance.

Figure 2:
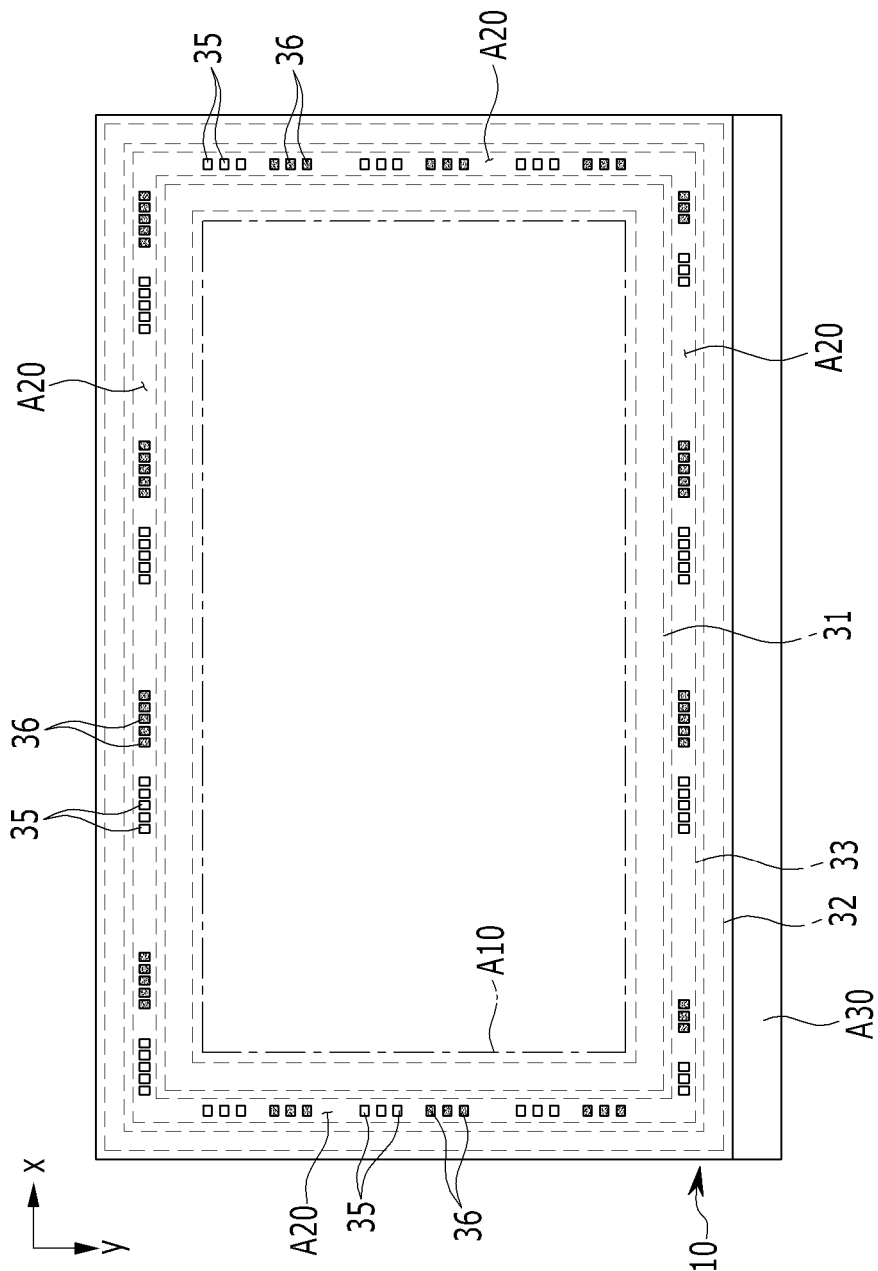
FIG. 2 is a top plan view of a substrate in the embodiment of an organic light emitting diode (OLED) display of FIG. 1.

FIG. 2 is a top plan view of a substrate in the embodiment of an organic light emitting diode (OLED) display shown in FIG. 1.

Referring to FIG. 1 and FIG. 2, wire and sealing areas A20 are disposed at outer sides of four edges of a display area A10. The first bonding layer 31, the conductive bonding layer 33, and the second bonding layer 32 are disposed at the wire and sealing area A20. A pad area A30 is disposed on the outside of the wire and sealing area A20, along at least one edge of the substrate 10. The pad area A30 is shown to be disposed at a bottom longer side of the substrate in the embodiment of FIG. 2, but the location of the pad area A30 is not limited thereto in other embodiments.

In the wire and sealing area A20, a first pad unit 35 and a second pad unit 36 are disposed. The first pad unit 35 is electrically connected to the common power line 41 of the display unit 40, and the second pad unit 36 is electrically connected to the common electrode 42 of the display unit 40. The first pad unit 35 and the second pad unit 36 are formed at all four wire and sealing areas A20. The first pad unit 35 and the second pad unit 36 may be alternatively and repeatedly disposed along a horizontal direction (x axis direction in the drawing) and a vertical direction (y axis direction in the drawing) of the substrate 10.

In FIG. 2, the second pad unit 36 is illustrated with a dot pattern in order to distinguish it from the first pad unit 35. Among the plurality of first pad units 35, the first pad unit 35 disposed at the longer side of the substrate 10 is electrically connected to the first common power line (not shown), and the first pad unit 35 disposed at a shorter side of the substrate 10 is electrically connected to the second common power line (not shown). In FIG. 2, the first pad units 35 and the second pad units 36 are only schematically illustrated. Accordingly, the number and the locations thereof are not limited thereto.

The first pad units 35 and the second pad units 36 are formed at predetermined positions corresponding to the conductive bonding layer 33 in the wire and sealing area A20. In some embodiments, the conductive bonding layer 33 has conductivity only in a thickness direction (z axis direction in drawing) and does not have conductivity in other directions. Accordingly, the first pad units 35 and the second pad units 36 are not shorted even if one conductive bonding layer 33 is connected to both the first pad units 35 and the second pad units 36.

In other embodiments, a conductive bonding layer having conductivity in all directions may be used. In such embodiments, the conductive bonding layer is formed as a first conductive bonding layer (not shown) disposed corresponding to the first pad unit 35 and a second conductive bonding layer (not shown) disposed corresponding to the second pad unit 36. The first conductive layer and the second conductive layer are separated at a predetermined distance so as not to be electrically connected.

Figure 3:
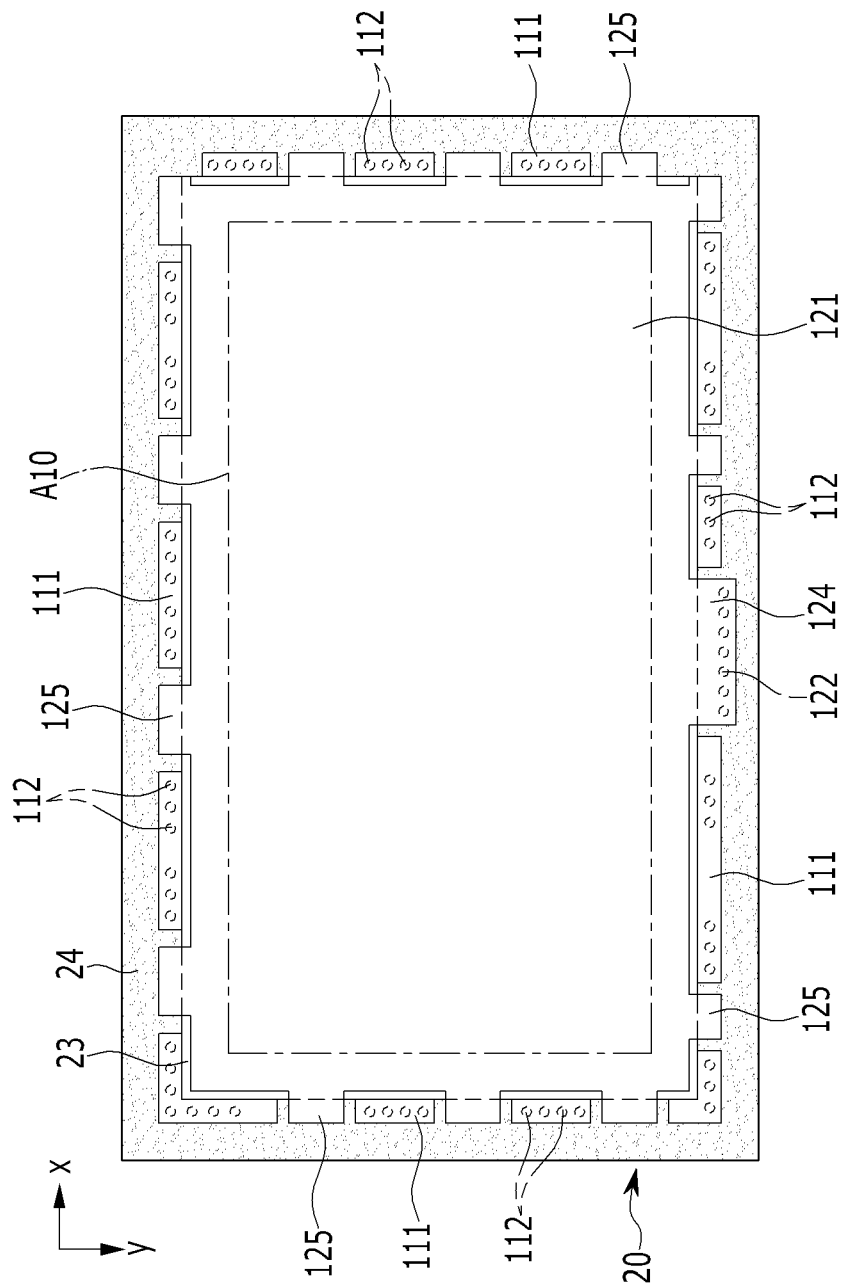
FIG. 3 is a top plan view illustrating an inner side of a sealing substrate in the embodiment of an organic light emitting diode (OLED) display of FIG. 1.
Figure 4:
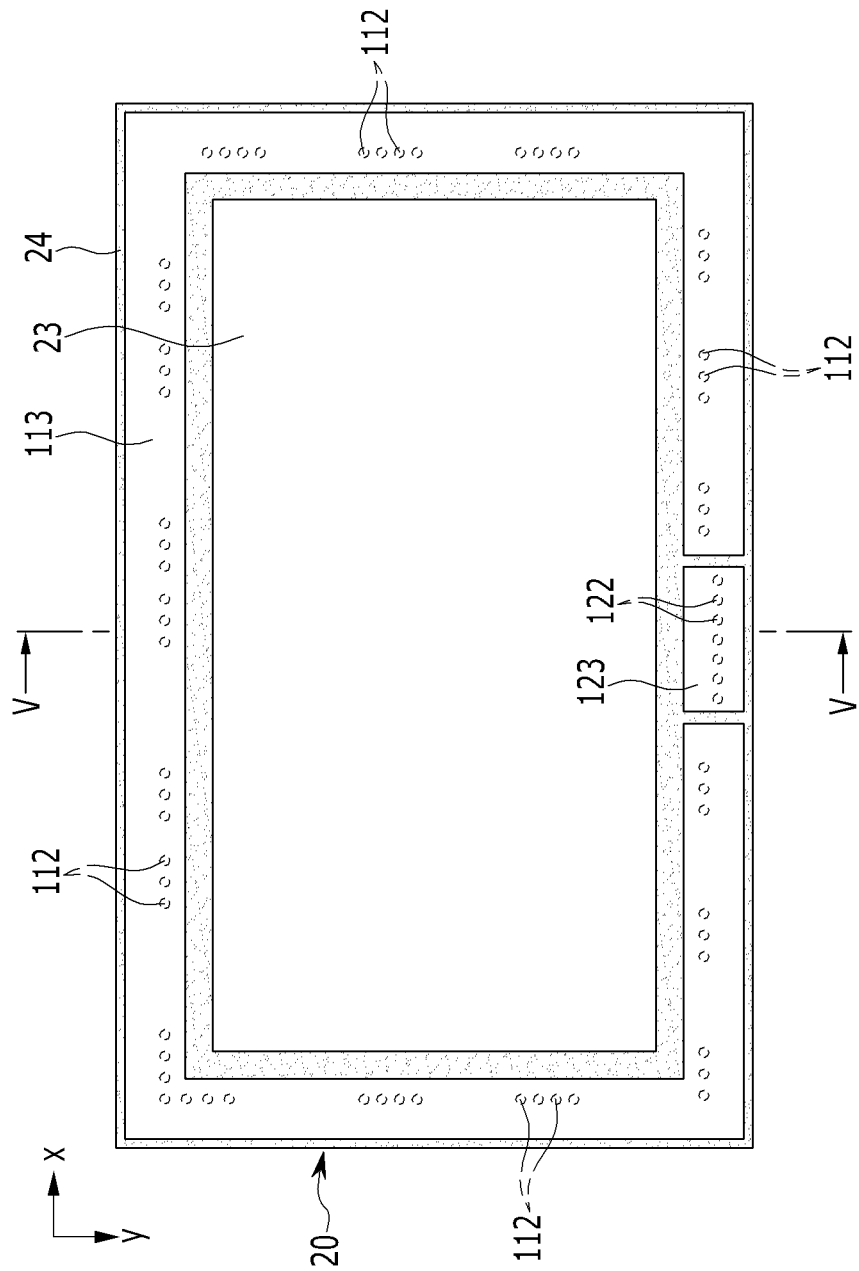
FIG. 4 is a top plan view illustrating an outer side of a sealing substrate in the embodiment of an organic light emitting diode (OLED) display of FIG. 1.
Figure 5:
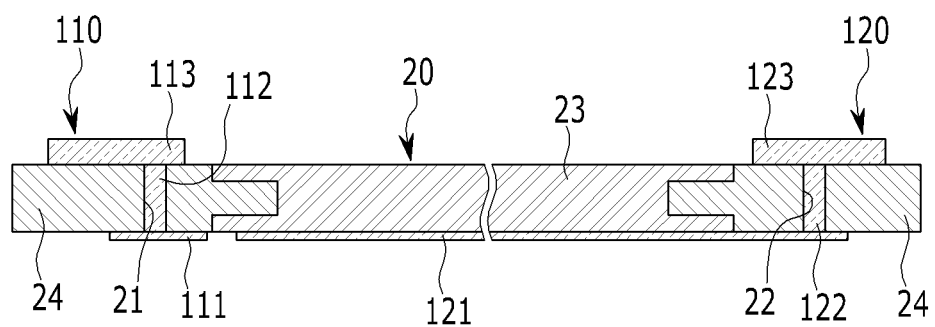
FIG. 5 is a cross-section view taken along the line V-V of FIG. 4.

FIG. 3 and FIG. 4 are top plan views illustrating an inner side and an outer side of a sealing substrate of the embodiment of an organic light emitting diode (OLED) display of FIG. 1. FIG. 5 is a cross-sectional view taken along line V-V of FIG. 4.

Referring back to FIG. 1, the sealing substrate 20 is formed to have a size covering the display area A10 and the four wire and sealing areas A20 of the substrate 10. Accordingly, the pad area A30 of the substrate 10 is externally exposed without overlapping with the sealing substrate 20.

The sealing substrate 20 includes a first penetration hole 21 for the electric signal supply of the common power line 41 and a second penetration hole 22 for the electric signal supply of the common electrode 42. The first conducting unit 110 is formed through an inner side of the sealing substrate 20, the first penetration hole 21, and an outer side of the sealing substrate 20. The second conducting unit 120 is formed through an inner side of the sealing substrate 20, the second penetration hole 22, and an outer side of the sealing substrate 20.

The sealing substrate 20 includes a complex member 23 and an insulator 24. The complex member 23 includes a resin matrix and a plurality of carbon fibers, and the insulator 24 is connected to an edge of the complex member 23. The first penetration hole 21 and the second penetration hole 22 are formed at the insulator 24. The first conducting unit 110 is formed at the insulator 24, and the second conducting unit 120 is formed over the complex member 23 and the insulator 24. The first conducting unit 110 and the second conducting unit 120 are respectively disposed at the inner side and the outer side of the sealing substrate 20 at a predetermined distance.

The complex member 23 faces the entire display unit 40 and is connected to the first bonding layer 31. The insulator 24 faces four wire and sealing areas A20 by being fixed at four edges of the complex members 23. The insulator 24 may be made of plastic, glass, or reinforcing fiber composite material. The reinforcing fiber may be glass fiber or aramid fiber. The composition of the insulator 24 is not limited thereto.

The complex member 23 may have a thermal expansion coefficient almost identical to that of the substrate 10 by controlling content of its carbon fiber and resin matrix. The almost identical thermal expansion coefficient prevents the substrate 10 and the sealing substrate 20 from bending due to a thermal expansion coefficient difference between them when the substrate 10 is adhered with the sealing substrate 20 by hardening the first and the second bonding layers 31 and 32 and the conductive bonding layer 33 with a high temperature.

The complex member 23 is conductive, due to its carbon fiber content. If the sealing substrate 20 were formed of only the complex member 23 and the first and second conducting units 110 and 120 were directly formed on the surface of the complex member 23, the first and second conducting units 110 and 120 would be shorted through the complex member 23. An insulating process is thus desirable before forming the first conducting unit 110 and the second conducting unit 120 on the complex member 23. The insulating process may include forming an insulating layer at a side wall of the first and second penetration holes 21 and 22 and of a surface of the complex member 23.

However, in embodiments disclosed herein, the first conducting unit 110 is insulated from the second conducting unit 120 without an additional insulating unit such as an insulating layer. The insulator 24 is connected at an edge of the complex member 23, and the first conducting unit 110 is formed at the insulator 24. The detailed structure and composite material of the complex member 23 and the insulator 24 is described below.

Referring to FIG. 3 to FIG. 5, the first conducting unit 110 includes a first inner layer 111 formed at an inner side of the insulator 24, a first connection unit 112 contacting the first inner layer 11 and filling the first penetration hole 21, and a first outer layer 113 contacting the first connection unit 112 and formed at an outer side of the insulator 24.

The second conducting unit 120 includes a second inner layer 121 formed through an inner side of the insulator 24 and the complex member 23, a second connection unit 122 contacting the second inner layer 121 and filling the second penetration hole 22, and a second outer layer 123 contacting the second connection unit 122 and formed on an outer side of the insulator 24.

The second inner layer 121 is formed to have a predetermined size covering the entire display unit 40 and contacting the first bonding layer 31. The second inner layer 121 may be formed of a metal layer having low resistance and excellent in blocking moisture and oxygen, for example, an aluminum layer, an aluminum alloy layer, a copper layer, or a copper alloy layer. In other embodiments, the second inner layer 121 may be formed of a metal foil including aluminum or copper.

The second inner layer 121 closely contacts the first bonding layer 31 and completely covers the display unit 40 inside the first bonding layer 31. Accordingly, the second inner layer 121 protects the display unit 40 and blocks the penetration of external moisture and oxygen from outside. External moisture and oxygen are blocked firstly by the complex member 23 having a dense structure and blocked secondly by the second inner layer 121. Accordingly, the complex member 23 having the second inner layer 121 may secure high air-tightness similar to that of a glass substrate.

The second inner layer 121 includes a first expansion unit 124 formed at an inner side of the insulator 24 to contact the second connection unit 122 and a plurality of second expansion units 125 contacting the conductive bonding layer 22 on an inner side of the insulator 24 to be overlapped with the second pad unit 36 of the substrate 10. Accordingly, the second pad unit 36 of the substrate 10 is electrically connected to the second inner layer 121 through the conductive bonding layer 33 and the second expansion unit 125.

The first inner layer 111 is formed to contact the conductive bonding layer 33 between the second expansion units 125 of the second inner layer 121. A plurality of first inner layers 111 are formed and overlapped with the first pad unit 35 with the conductive bonding layer 33 interleaved. Accordingly, the first pad unit 35 of the substrate 10 is electrically connected to the first inner layer 111 through the conductive bonding layer 33.

Since the second inner layer 121 is formed directly on the complex member 23, the complex member 23 is electrically connected to the second conducting unit 120. However, the first conducting unit 110 and the second conducting unit 120 are not shorted because the first inner layer 111 and the first and second expansion units 124 and 125 are separated on the insulator 24.

The first outer layer 113 and the second outer layer 123 are formed on an outer side of the insulator 24 at a predetermined distance. The first outer layer 113 is formed to be overlapped with a plurality of the first inner layers 111, and the second outer layer 123 is formed to be overlapped with the second connection unit 122. For example, as shown in FIG. 4, the second outer layer 123 may be formed at a part of an edge of one longer side of the insulator 24, and the first outer layer 113 may be formed at the remaining edges of the insulator 24.

An external contact terminal (not shown) is attached at the first outer layer 113 and the second outer layer 123. Therefore, the first outer layer 113 receives a first electric signal of the common power line 41 from the external contact terminal and transfers the first electric signal to the first inner layer 111. The second outer layer 123 receives a second electric signal of a common electrode 42 from the external contact terminal and transfers the second electric signal to the second inner layer 121.

The first outer layer 113 is formed to have at least one of a width and a thickness greater than that of the first inner layer 111, and the second outer layer 123 may be formed to have a thickness greater than that of the second inner layer 121. The first inner layer 111 and the second inner layer 121 are formed to have the same thickness, and the first outer layer 113 and the second outer layer 123 are formed to have the same thickness in order to prevent a step difference between the substrate 10 and the sealing substrate 20 in a process of adhering the substrate 10 and the sealing substrate 20. The above described structure may be easily applied to a large organic light emitting diode (OLED) display having a great current capacity.

Figure 6:
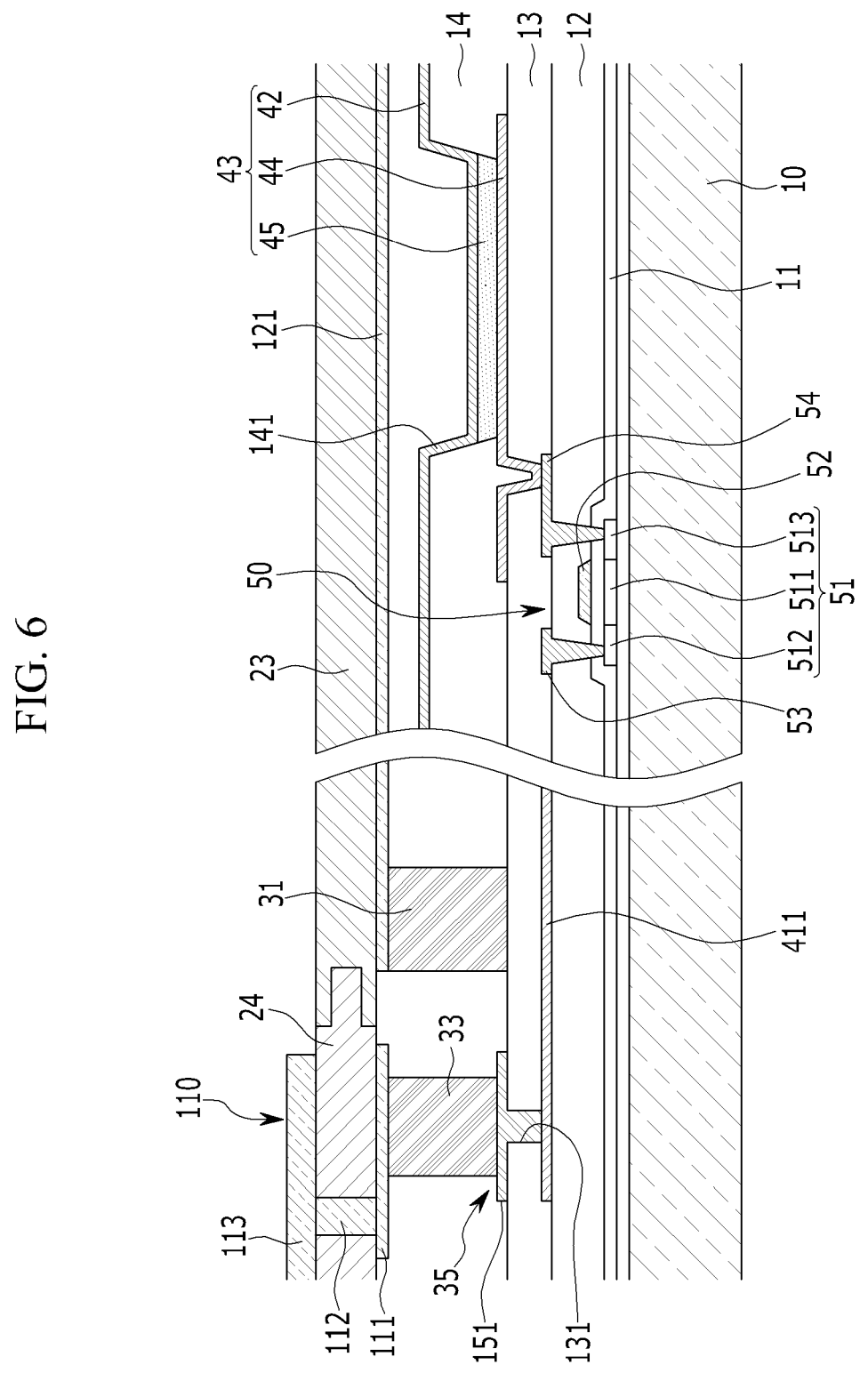
Figure 7:
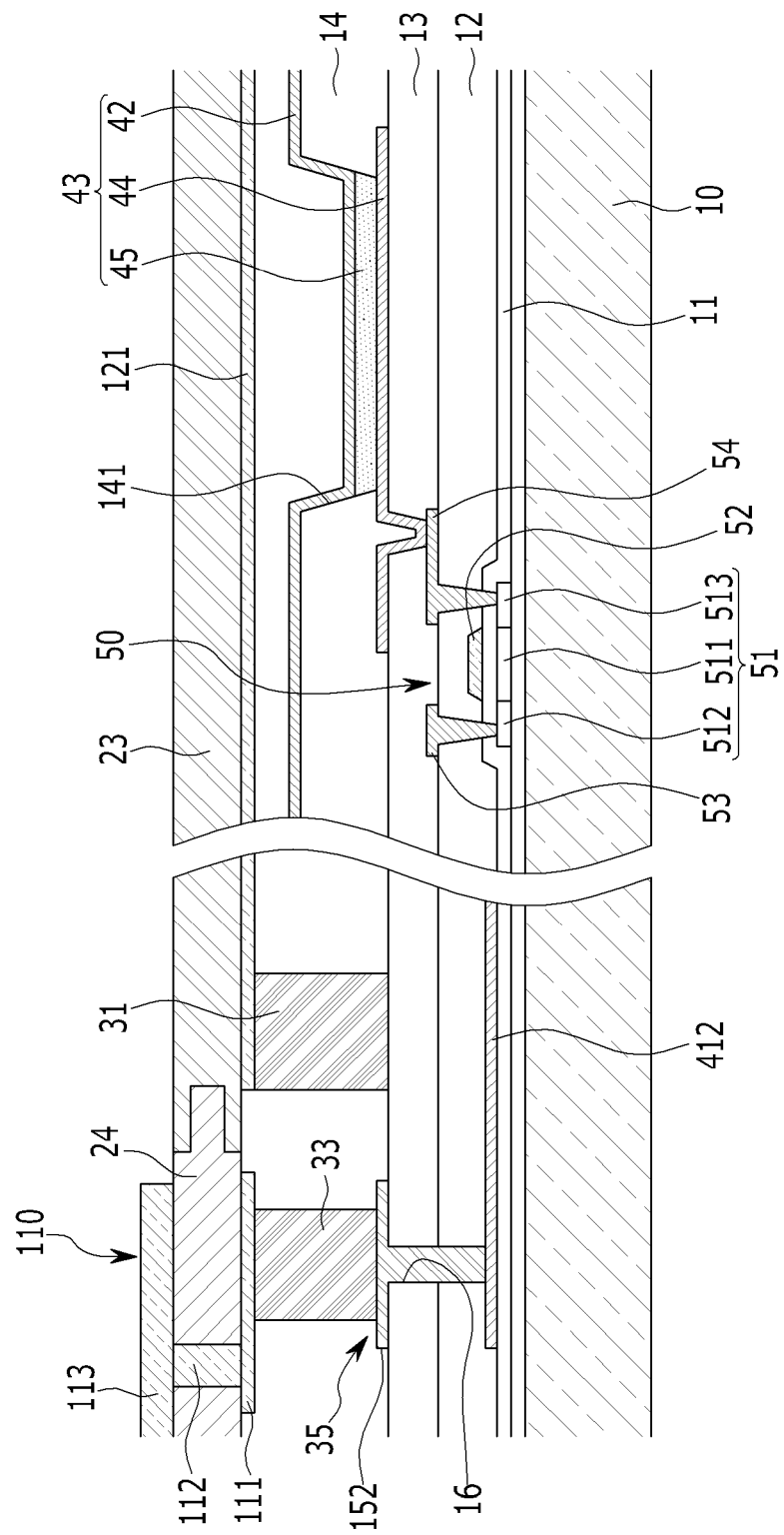
Figure 8:
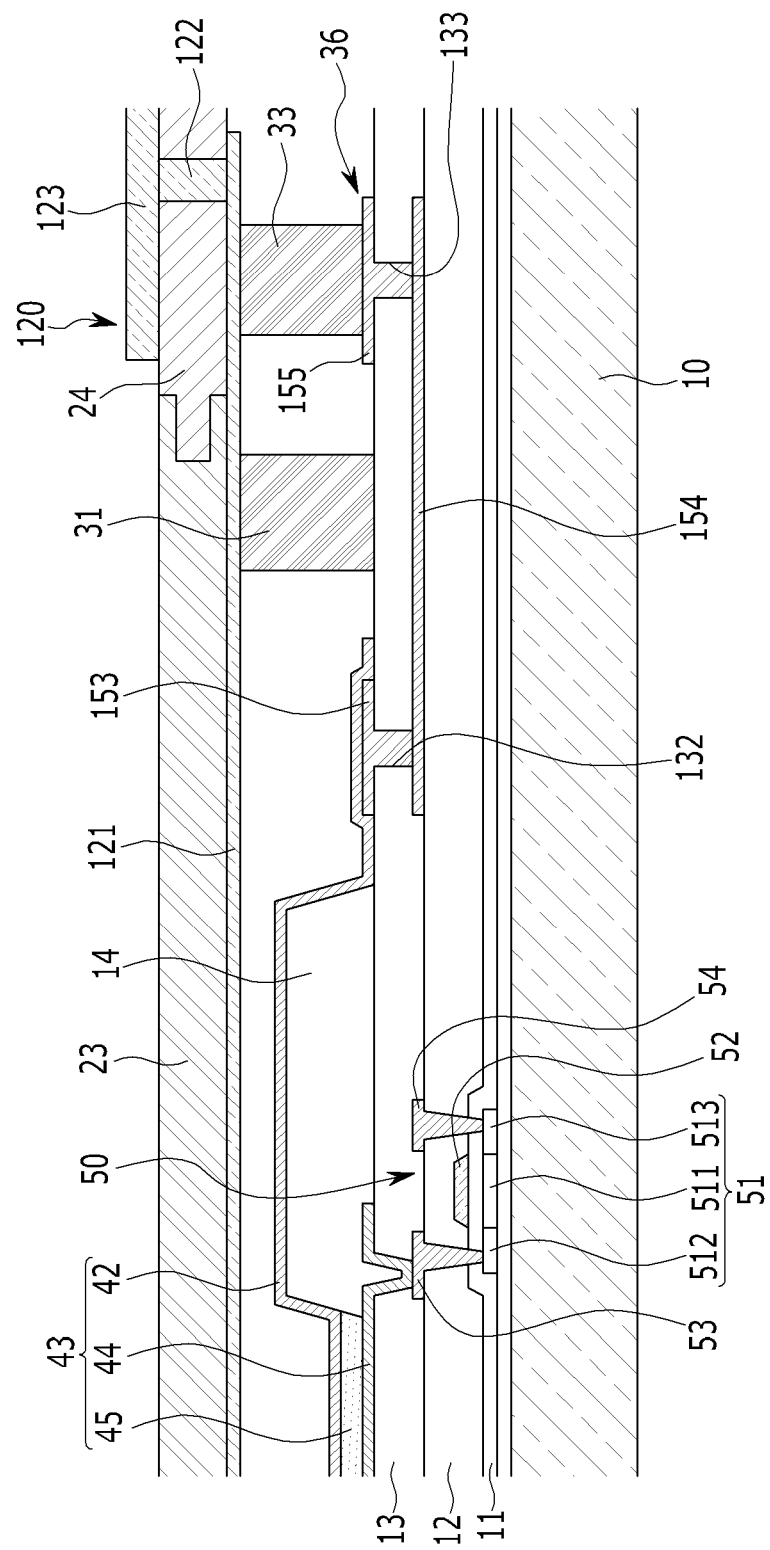

FIG. 6 to FIG. 8 are partial enlarged cross-sectional views of an embodiment of an organic light emitting diode (OLED) display. FIG. 6 illustrates the first common power line 411 and the first pad unit 35 in detail. FIG. 7 illustrates the second common power line 412 and the first pad unit 35 in detail. FIG. 8 illustrates the common electrode 42 and the second pad unit 36 in detail.

Referring to FIG. 6 to FIG. 8, an organic light emitting element 43 and a driving circuit are formed at each pixel in the display unit 40. The driving circuit includes at least two thin film transistors and at least one capacitor. In FIG. 6 to FIG. 8, the display unit 40 is schematically illustrated to have one thin film transistor 50 and one organic light emitting element 43.

The thin film transistor 50 includes a semiconductor layer 51, a gate electrode 52, a source electrode 53, and a drain electrode 54. The semiconductor layer 51 is formed as a polysilicon layer and includes a channel region 511, a source region 512, and a drain region 513. The channel region 511 includes an intrinsic semiconductor where impurity is not doped. The source region 512 and the drain region 513 each include an impurity semiconductor where impurity is doped.

The gate electrode 52 is formed on the channel region 511 of the semiconductor layer 51 with the gate insulating layer 11 interleaved. The source electrode 53 and the drain electrode 54 are formed on the gate electrode 52 with the interlayer insulating layer 12 interleaved. The source region 512 and the drain region 513 are connected to each other through a contact hole formed at the interlayer insulating layer 12. A planarization layer 13 is formed on the source electrode 53 and the drain electrode 54, a pixel electrode 44 is formed on the planarization layer 13. A pixel electrode 44 is connected to the drain electrode 54 through a contact hole of the planarization layer 13.

A pixel defining layer 14 is disposed on the pixel electrode 44 and the planarization layer 13. The pixel defining layer 14 exposes a part of the pixel electrode 44 by forming a first opening 141 at each pixel. An organic emission layer 45 is formed on the exposed pixel electrode 44, and a common electrode 42 is formed on the entire display unit 40 to cover the organic emission layer 45 and the pixel defining layer 14. The pixel electrode 44, the organic emission layer 45, and the common electrode 42 form an organic light emitting element 43.

The pixel electrode 44 may be a hole injection electrode, and the common electrode 42 may be an electron injection electrode. In such embodiments, the organic emission layer 45 can be formed of a hole injection layer (HIL), a hole transport layer (HTL), an emission layer, an electron transport layer (ETL), and an electron injection layer (EIL) sequentially stacked from the pixel electrode 44. Holes and electrons are injected to the organic emission layer 45 from the pixel electrode 44 and the common electrode 42, and light is emitted when excitons coupled with the injected holes and electrons drop from an excited state to a ground state.

The pixel electrode 44 is formed of a transparent conductive layer, and the common electrode 42 is formed of a reflective conductive layer. Light emitted from the organic emission layer 45 is reflected by the common electrode 42 and discharged to the outside through the substrate 10. Such a light emitting structure is referred as a bottom light emission type. The pixel electrode 44 may be formed of three layers of indium tin oxide (ITO)/silver (Ag)/ITO, and the common electrode 42 may include at least one of silver (Ag), aluminum (Al), silver alloy, and aluminum alloy.

The first common power line 411 and the second common power line 412 may be formed at the same layer of at least one of the gate electrode 52 and the source/drain electrodes 53 and 54. In FIG. 6, the first common power line 411 is formed of the same material and at the same layer as the source/drain electrodes 53 and 54. In FIG. 7, the second common power line 412 is formed of the same material and at the same layer as the gate electrode 52.

Referring to FIG. 6 and FIG. 7, one end of the first common power line 411 and the second common power line 412 extends to the wire and sealing area A20 outside of the display unit 40. At least one of four insulating layers formed on the display unit 40 extends to the wire and sealing area A20. In some embodiments, one end of the first common power line 411 may be covered by the planarization layer 13, and one end of the second common power line 412 may be covered by the interlayer insulating layer 12 and the planarization layer 13.

The planarization layer 13 includes a second opening 131 exposing one end of the first common power line 411, and a first pad conductive layer 151 is formed on the planarization layer 13 to electrically connect to the first common power line 411 through the second opening 131. The first pad unit 35 disposed at the longer side of the substrate 10 may be defined as a first pad conductive layer 151.

A third opening 16 is formed in the interlayer insulating layer 12 and the planarization layer 13 to expose one end of the second common power line 412, and a second pad conductive layer 152 is formed on planarization layer 13 to electrically connect the second common power line 412 through the third opening 16. The first pad unit 35 disposed at a shorter side of the substrate 10 may be defined as the second pad conductive layer 152. The first pad conductive layer 151 and the second pad conductive layer 152 may be formed at the same layer as the pixel electrode 44 and may be made of the same material as the pixel electrode 44.

Referring to FIG. 8, the common electrode 42 is disposed at an inner side of the first bonding layer 31, and the second pad unit 36 is formed over an inner side and an outer side of the first bonding layer 31, thereby electrically connecting the common electrode 42 and the conductive bonding layer 33.

The second pad unit 36 includes a third pad conductive layer 153, a fourth pad conductive layer 154, and a fifth pad conductive layer 155. The third pad conductive layer 153 is disposed at an inner side of the first bonding layer 31 and contacts the common electrode 42. The fourth pad conductive layer 154 is connected to the third pad conductive layer 153 through a fourth opening 132 of the planarization layer 13 and disposed over an inner layer and an outer layer of the first bonding layer 31. The fifth pad conductive layer 155 is disposed between the conductive bonding layer 33 and the planarization layer 13 and is connected to the fourth pad conductive layer 154 through the fifth opening 133 of the planarization layer 13.

The third pad conductive layer 153 and the fifth pad conductive layer 155 may be made of the same material and formed at the same layer as the pixel electrode 44. The fourth pad conductive layer 154 may be made of the same material and formed at the same layer as at least one of the gate electrode 52 and the source/drain electrode 53 and 54. In the embodiment of FIG. 8, the fourth pad conductive layer 154 is formed at the same layer of the source/drain electrodes 53 and 54.

In other embodiments, the second pad unit 36 may be applied to any structure that can electrically connect the common electrode 43 of the display unit 40 and the conductive bonding layer 33 of the wire and sealing area A20.

In the organic light emitting diode (OLED) display 100, an electric signal is applied to each of the common power line 41 and the common electrode 42 by forming the first conducting unit 110 and the second conducting unit 120 at the sealing substrate 20. As described above, the sealing substrate 20 is formed of the complex member 23 and the insulator 24. Accordingly, a process of forming an insulating layer to insulate the first conducting unit 110 from the second conducting unit 120 may be omitted.

In order to conveniently manufacture the sealing substrate 20, the first penetration hole 21 and the second penetration hole 22 are formed in the insulator 24. In some embodiments, holes may be formed simultaneously when the insulator 24 is manufactured by injection molding or extruding plastic. insulatorinsulator In some embodiments of the organic light emitting diode (OLED) display 100, a boundary surface of the complex member 23 and the insulator 24 is formed for improving coherence of the complex member 23 and the insulator 24, for planarization of the sealing substrate 20, and for preventing the sealing substrate 20 from bending in a baking process.

Figure 9:
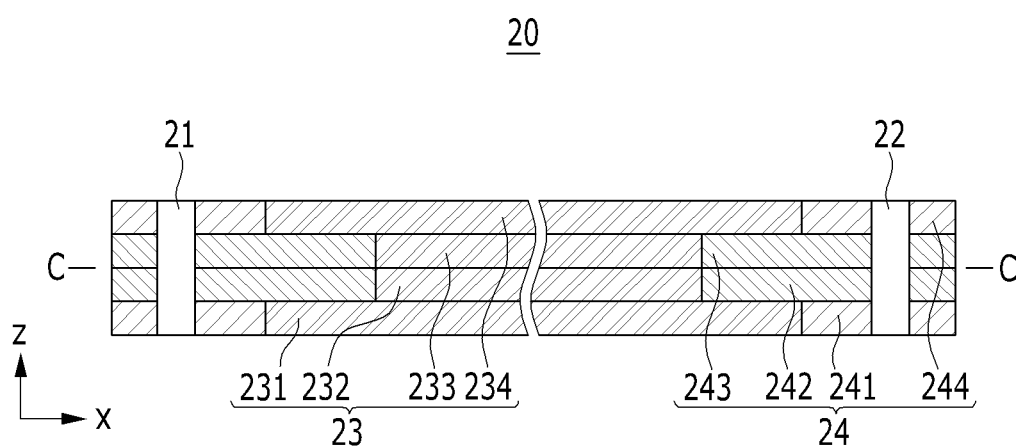
FIG. 9 is a partial enlarged cross-sectional view of FIG. 5 with the first conducting unit and the second conducting unit removed.

FIG. 9 is a partial enlarged cross-sectional view illustrating a sealing substrate with a first conducting member and a second conducting member removed therefrom.

Referring to FIG. 9, the complex member 23 and the insulator 24 are coupled by tongue and groove coupling to form a protrusion groove structure which is top-to-bottom symmetric along a thickness direction of the sealing substrate 20 (z axis direction of drawing). The insulator 24 has the same thickness as the complex member 23. As shown in FIG. 9, a recess portion (i.e. a groove) is formed at a center of a side of the complex member 23, and a tongue is formed at a center of a side of the insulator. However, in some embodiments, the tongue and groove can be reversed such that the tongue is formed in the complex member 23 and the groove formed in the insulator The complex member 23 and the insulator 24 are symmetric in a top-to-bottom direction based on a virtual central line (C-C) dividing the sealing substrate 20 in half along the thickness direction of the sealing substrate 20 as a reference. The symmetric structure in top-to-bottom is based on the drawings as a reference. It may be described as a symmetric structure in side-to-side according to an arrangement state of the sealing substrate 20 in other embodiments.

The complex member 23 has high mechanical property because the complex member 23 includes a high strength carbon fiber. Accordingly, the complex member 23 may have a thin thickness, such as for example, about 1 mm. If a boundary surface of the complex member 23 and the insulator 24 is formed as one vertical surface, it is difficult to firmly fix the insulator 24 at a side of the complex member 23 due to a comparatively small coupling area. As a result, the complex member 23 may be separated from the insulator 24 after manufacturing the sealing substrate 20.

In order to overcome such a defect, an additional process for improving coherence of the insulator 24 and the complex member 23 is required. For example, an additional process may be a process of forming the insulator 24 thicker than the complex member 23, or a process of covering a part of the complex member 23 with the insulator 24. However, a coupling defect may be generated when the substrate 10 is adhered to the sealing substrate 20 if the insulator 24 is formed to have a thickness thicker than that of the complex member 23.

In embodiments disclosed herein, a coupling area of the complex member 23 and the insulator 24 is enlarged due to the protrusion-groove coupling structure of the complex member 23 and the insulator 24. Accordingly, the coherence of the complex member 23 and the insulator 24 is improved. Such a structure prevents the complex member 23 from being separated from the insulator 24. Further, since the flatness of the sealing substrate 20 is improved by forming the insulator 24 to have the same thickness as the complex member 23, the coupling defect may be prevented when the substrate 10 is adhered with the sealing substrate 20.

The complex member 23 and the insulator 24 have a top-to-bottom symmetric structure along a thickness direction. Accordingly, it is possible to prevent the sealing substrate 20 from bending in a predetermined direction during a process of manufacturing the sealing substrate 20 because material does not lean too much toward to any side. A detailed structure of the complex member 23 and the insulator 24, and a process of manufacturing a sealing substrate 20 is described below.

The complex member 23 has a stacked structure which includes a first complex layer 231, a second complex layer 232 having a width smaller than that of the first complex layer 231, a third complex layer 233, and a fourth complex layer 234 having the same width of the first complex layer 231. The second complex layer 232 and the third complex layer 233 have the same size, and the first complex layer 231 to the fourth complex layer 234 are formed in the same thickness.

The insulator 24 has a stacked structure including a first insulating layer 241, a second insulating layer 242, and a third insulating layer 243 having a width wider than that of the first insulation layer 241, and a fourth insulating layer 244 having the same width of the first insulation layer 241. The first insulation layer 241 to the fourth insulation layer 244 respectively contact and surround sides of the first complex layer 231 to the fourth complex layer 234. The second insulation layer 242 and the third insulation layer 243 have the same size, and the first insulation layer 241 to the fourth insulation layer 244 are formed to have the same thickness.

Figure 10:
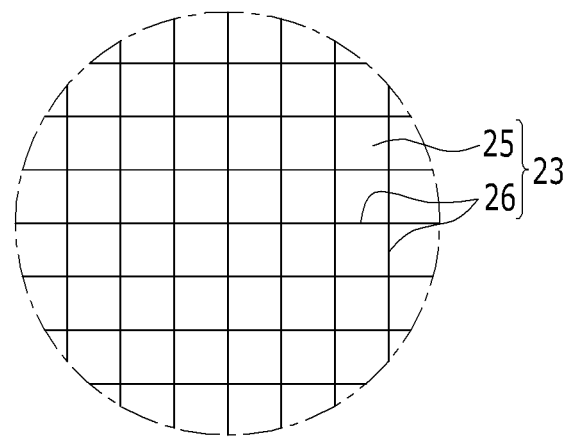
FIG. 10 is a partial enlarged top plan view schematically illustrating a part of a complex member in the embodiment of a sealing substrate shown in FIG. 9.

FIG. 10 is a top plan view schematically illustrating a part of a complex member in an embodiment of a sealing substrate shown in FIG. 9.

Referring to FIG. 9 and FIG. 10, each one of the first complex layer 231 to the fourth complex layer 234 of the complex member 23 includes a resin matrix 25 and a plurality of carbon fibers impregnated in the resin matrix 25. The carbon fibers 26 are arranged to cross each other. In some embodiments, the plurality of carbon fibers may have a structure weaved with woof and warp. In FIG. 10, the carbon fibers 26 orthogonally cross each other. In other embodiments, the carbon fibers 26 may cross each other at any other angle.

The arrangement direction of the carbon fibers 26 is identical in each of the first complex layer 231 to the fourth complex layer 234. Since the substrate 10 of the organic light emitting diode (OLED) display 100 is processed through heat treatment several times to form a driving circuit and an organic light emitting element thereon, the substrate 10 is formed with glass or polymer resin having small thermal expansion coefficient.

The carbon fibers 26 have a thermal expansion coefficient lower than that of the substrate 10, and the thermal expansion coefficient of the carbon fibers 26 in the length direction has a minus value. The resin matrix 25 has a thermal expansion coefficient higher than that of the substrate 10. Therefore, the overall thermal expansion coefficient of the complex member 23 may be set to be identical to that of the substrate 10 by controlling the amount of the carbon fiber 26 and the amount of the resin matrix 25.

Figure 11:
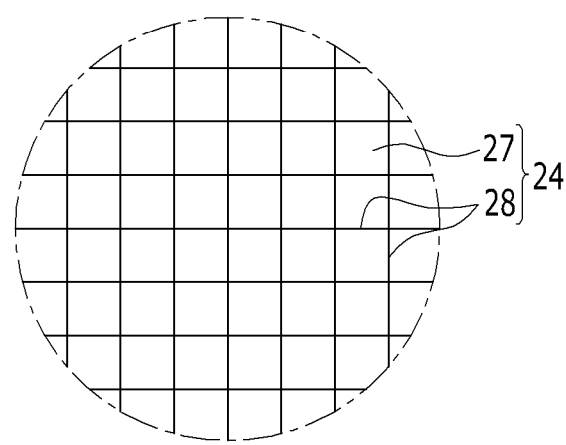
FIG. 11 is a partial enlarged top plan view schematically illustrating a part of an insulator in the embodiment of a sealing substrate shown in FIG. 9.

FIG. 11 is a partial enlarged top plan view schematically illustrating a part of an insulator in an embodiment of a sealing substrate shown in FIG. 9.

Referring to FIG. 9 and FIG. 11, each one of the first insulation layer 241 to the fourth insulation layer 244 of the insulator 24 includes a resin matrix 27 and a plurality of reinforcing fibers 28 impregnated to the resin matrix 27. The reinforcing fiber 28 may be glass fiber or aramid fiber. The plurality of reinforcing fibers 28 are arranged to cross each other. In some embodiments, the plurality of reinforcing fibers 28 have a structure weaved with woof and warp. Although the reinforcing fibers 28 orthogonally cross each other in FIG. 11, the reinforcing fibers 28 may cross each other at other angles in other embodiments.

The arrangement direction of the reinforcing fibers 28 is identical in each of the first insulation layer 241 to the fourth insulation layer 244.

Referring to FIG. 9 to FIG. 11, the sealing substrate 20 is formed by sequentially stacking the first complex layer 231 and the first insulation layer 241, the second complex layer 232 and the second insulation layer 242, the third complex layer 233 and the third insulation layer 243, and the fourth complex layer 234 and the fourth insulation layer 244, and hardening the stacked structure through pressurizing and baking. In some embodiments, the reinforcing fiber 28 has a thermal expansion coefficient about two times higher than that of glass fiber.

If the complex member 23 and the insulator 24 are not top-to-bottom symmetric along a thickness direction, the reinforcing fiber 28 leans too much toward to one side along the thickness direction. Consequently, the side with more reinforcing fibers 28 is contracted more than the side with less reinforcing fibers 28 when a temperature is dropped after baking. Therefore, one side pulls the complex member 23 and the sealing substrate 20 is thus bent.

In embodiments disclosed herein, the complex member 23 and the insulating layer 24 are top-to-bottom symmetric along the thickness direction, and thus the sealing substrate 20 is not bent when the temperature is dropped after baking because the reinforcing fiber 28 does not lean toward any one side. An expansion-contraction difference of the reinforcing fiber 28 and the carbon fiber 26 is top-to-bottom symmetric based on a central line as a reference. Accordingly, the sealing substrate 20 is not bent in any direction. Therefore, the flat sealing substrate 20 can be manufactured by preventing the sealing substrate 20 from bending.

Figure 12:
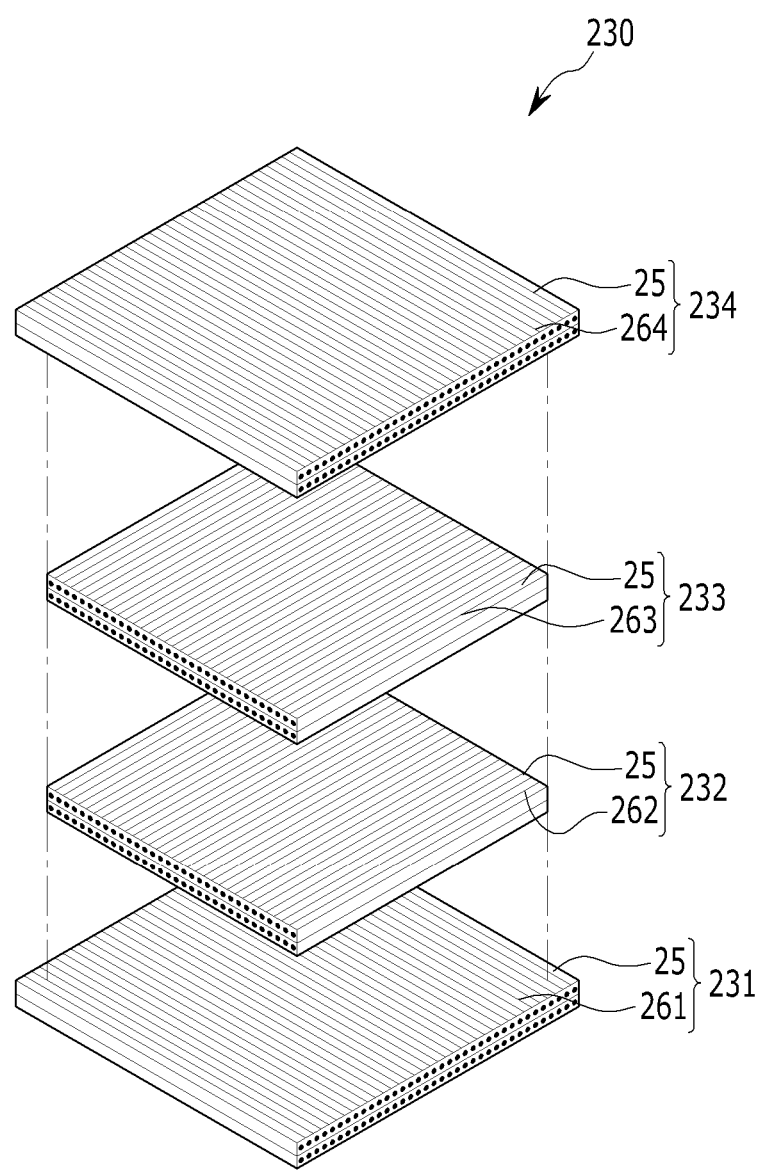
FIG. 12 is an exploded perspective view of a complex member according to a first exemplary variation of the embodiment of a sealing substrate shown in FIG. 9.

FIG. 12 is an exploded perspective view of a complex member according to a first exemplary variation of the embodiment of a sealing substrate shown in FIG. 9.

Referring to FIG. 12, each one of a first complex layer 231 to a fourth complex layer 234 of a complex member 230 includes resin matrix 25 and a plurality of carbon fibers 261, 262, 263, and 264 arranged along one direction inside the resin matrix 25. The plurality of carbon fibers 261, 262, 263, and 264 are impregnated into the resin matrix 25. In some embodiments, the insulator (not shown) has the same structure as the insulator 24 shown in FIG. 11.

The carbon fiber 261 of the first complex layer 231 and the carbon fiber 264 of the fourth complex layer 234 are arranged along a first direction, and the carbon fiber 262 of the second complex layer 232 and the carbon fiber 263 of the third complex layer 233 are arranged along a second direction. The first direction and the second direction may be orthogonally crossed or not orthogonally crossed in various embodiments. In the embodiment of FIG. 12, the first direction and the second direction are not orthogonally crossed.

Since a horizontal direction thermal expansion coefficient becomes identical to a vertical direction thermal expansion coefficient in the complex member 230, it is possible to prevent the sealing substrate 20 from bending.

Figure 13:
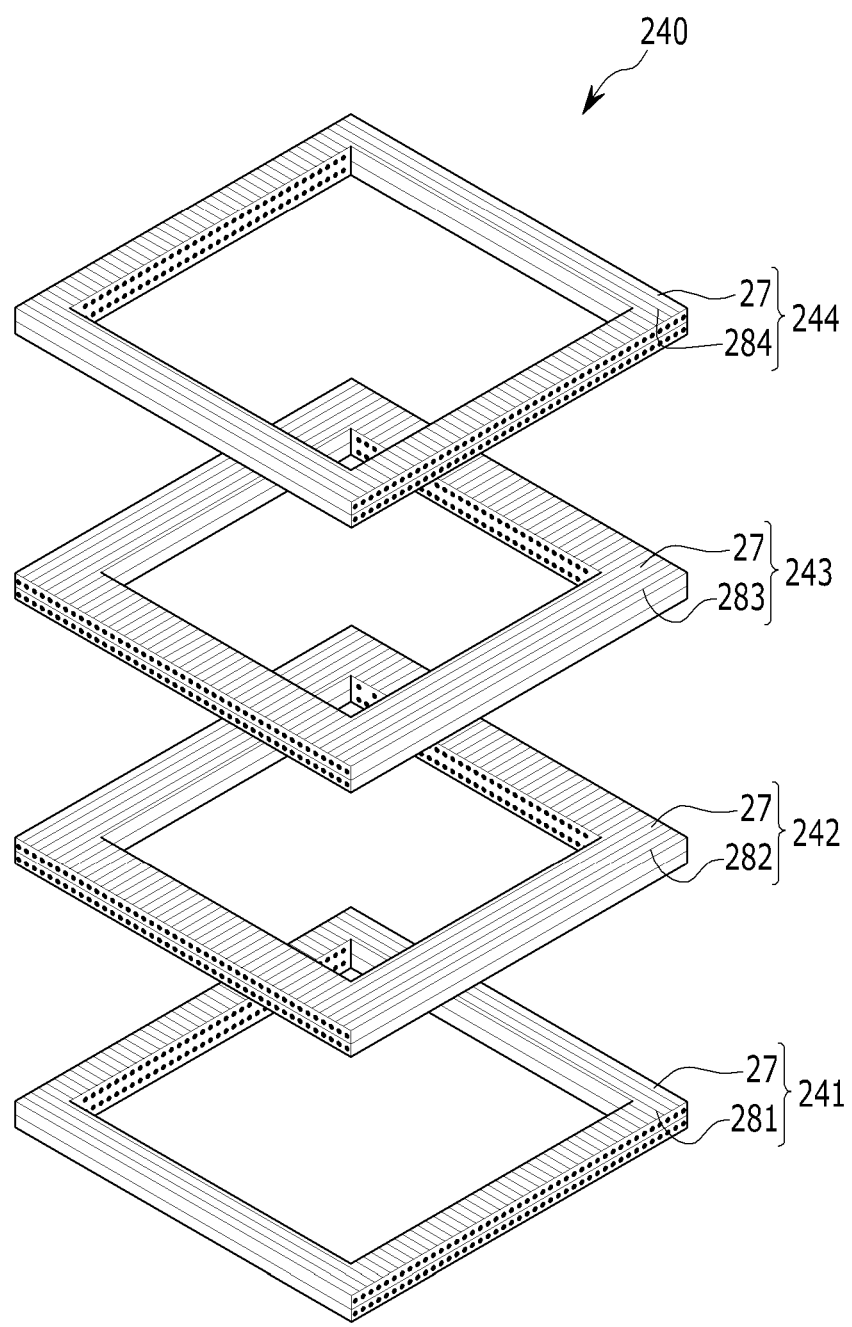
FIG. 13 is an exploded perspective of an insulator according to a second exemplary variation of the embodiment of a sealing substrate shown in FIG. 9.

FIG. 13 is an exploded perspective view of an insulator according to a second exemplary variation of the embodiment of a sealing substrate of FIG. 9.

Referring to FIG. 13, each one of a first insulation layer 241 to a fourth insulation layer 244 of an insulator 240 includes a resin matrix 27 and a plurality of reinforcing fibers 281, 282, 283, and 284 arranged in one direction in the resin matrix 27. The plurality of reinforcing fibers 281, 282, 283, and 284 are impregnated to the resin matrix 27. In some embodiments, the complex member (not shown) has the same structure of the complex member 23 shown in FIG. 10.

The reinforcing fiber 281 of the first insulation layer 241 and the reinforcing fiber 284 of the fourth insulation layer 244 are arranged in a first direction. The reinforcing fiber 282 of the second insulation layer 242 and the reinforcing fiber 283 of the third insulation layer 243 are arranged in a second direction. The first direction and the second direction may be orthogonally crossed or may not be orthogonally crossed in various embodiments. In the embodiment of FIG. 13, the first direction and the second direction are orthogonally crossed.

In the insulator 240, a horizontal direction thermal expansion coefficient becomes identical to a vertical direction thermal expansion coefficient. Accordingly, the sealing substrate 20 is prevented from bending.

Figure 14:
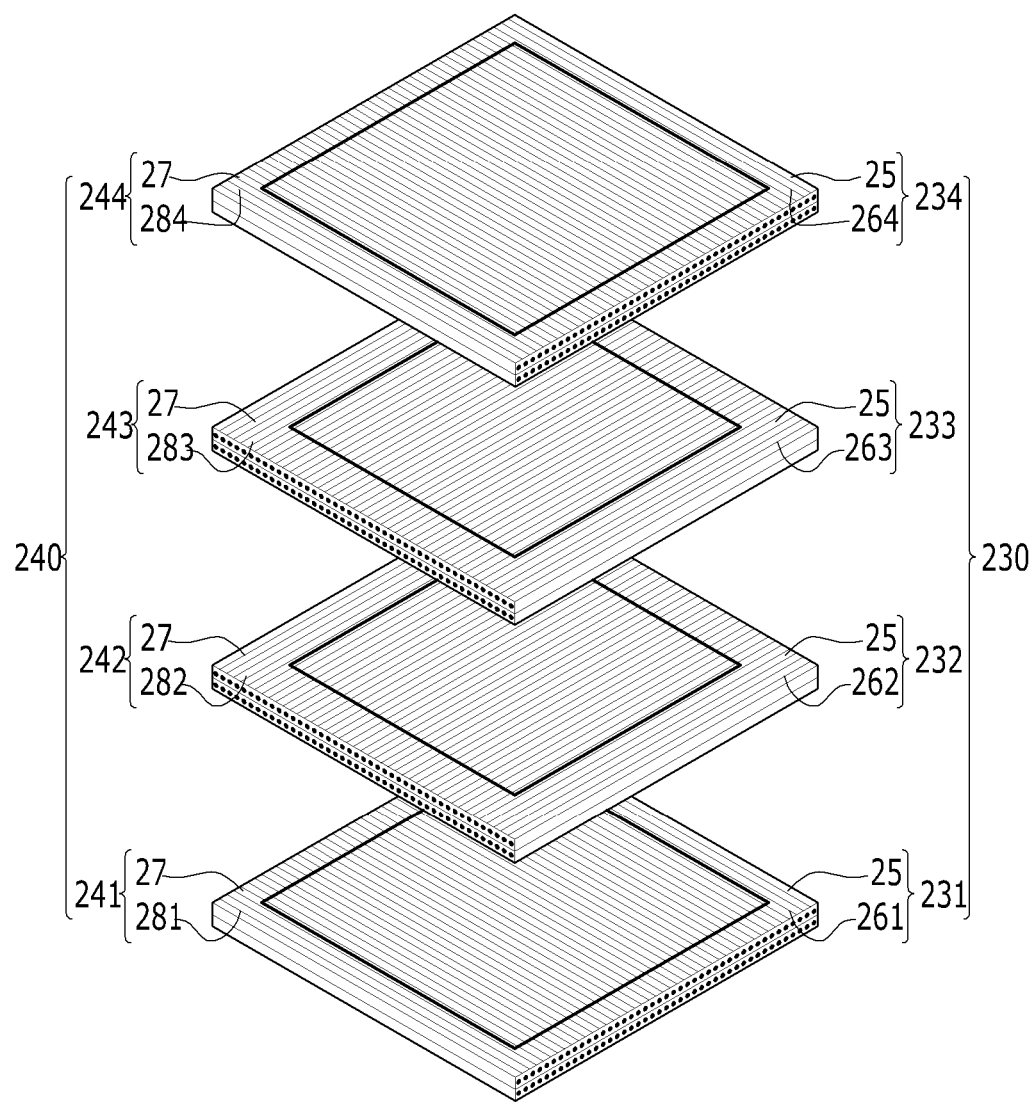
FIG. 14 is an exploded perspective view of a sealing substrate according to a third exemplary variation of the embodiment of a sealing substrate shown in FIG. 9.

FIG. 14 is an exploded perspective view of a sealing substrate according to a third exemplary variation of the embodiment of a sealing substrate shown in FIG. 9.

Referring to FIG. 14, each one of a first insulation layer 241 to a fourth insulation layer 244 of an insulator 240 includes a resin matrix 27 and a plurality of reinforcing fibers 281, 282, 283, and 284 arranged in one direction in the resin matrix 27. Each one of the first complex layer 231 to the fourth complex layer 234 of the complex member 230 includes a resin matrix 25 and a plurality of carbon fibers 261, 262, 263, and 264 arranged along one direction in the resin matrix 25. The plurality of reinforcing fibers 281, 282, 283, and 284 and the plurality of carbon fibers 261, 262, 263, and 264 are impregnated to a corresponding resin matrix 25 and 27.

The reinforcing fiber 281 of the first insulation layer 241 and the reinforcing fiber 284 of the fourth insulation layer 244 are arranged in a first direction. The reinforcing fiber 282 of the second insulation layer 242 and the reinforcing fiber 283 of the third insulation layer 243 are arranged in a second direction. The carbon fiber 261 of the first complex layer 231 and the carbon fiber 264 of the fourth complex layer 234 are arranged in the first direction. The carbon fiber 262 of the second complex layer 232 and the carbon fiber 263 of the third complex layer 233 arranged in the second direction.

The first direction and the second direction may be orthogonally crossed or not orthogonally crossed in various embodiments. In the embodiment of FIG. 14, the first direction and the second direction are orthogonally crossed. In the complex member 230 and the insulator 240, a horizontal direction thermal expansion coefficient becomes identical to a vertical direction thermal expansion coefficient. Accordingly, the sealing substrate 20 is prevented from bending.

Figure 15:
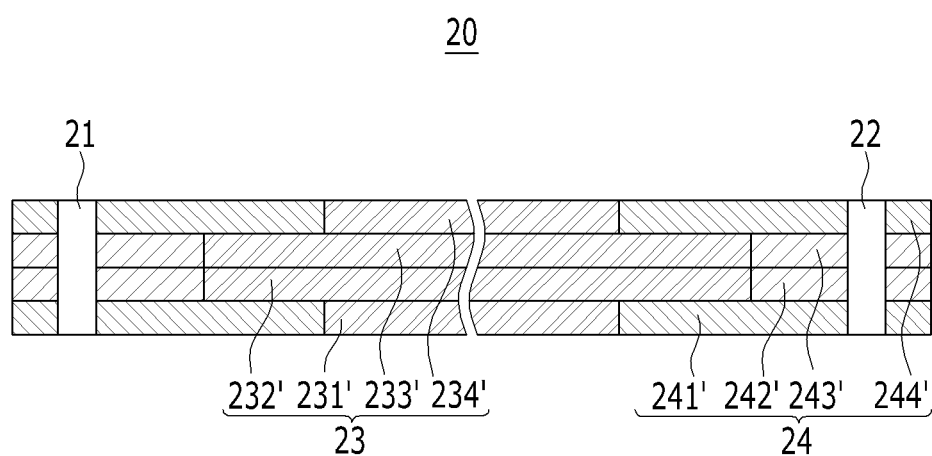
FIG. 15 is a cross-sectional view of a sealing substrate according to a fourth exemplary variation of the embodiment of a sealing substrate shown in FIG. 9.

Although a recess portion is formed at a center of a side of the complex member 23, a protruding portion may be formed at a center of a side of the complex member 23 as shown in FIG. 15. FIG. 15 is a cross-sectional view illustrating a sealing substrate according to a fourth exemplary variation of the embodiment of a sealing substrate FIG. 9.

Referring to FIG. 15, the complex member 23 has a stacked structure of a first complex layer 231', a second complex layer 232' and a third complex layer 232' having a width greater than that of the first complex layer 231', and a fourth complex layer 234' having the same width of the first complex layer 231'. The insulator 24 has a stacked structure of a first insulating layer 241', a second insulating layer 242' and a third insulating layer 243' having a width smaller than that of the first insulation layer 241', and a fourth insulating layer 244' having a width identical to that of the first insulation layer 241'.

The first insulation layer 241' to the fourth insulation layer 244' respectively contact and surround the first complex layer 231' to the fourth complex layer 234'. The detailed structure of the first complex layer 231' to the fourth complex layer 234' and the detailed structure of the first insulation layer 241' to the fourth insulation layer 244' are identical to those shown in FIG. 10 to FIG. 14. Accordingly, the detailed descriptions thereof are omitted.

In some embodiments, the complex member 23 and the insulator 24 include four layers. In other embodiments, the complex member 23 and the insulator 24 may include more than four layers, such as for example, an even number of layers more than four, such as six layers or eight layers, or any number of layers.

Figure 16:
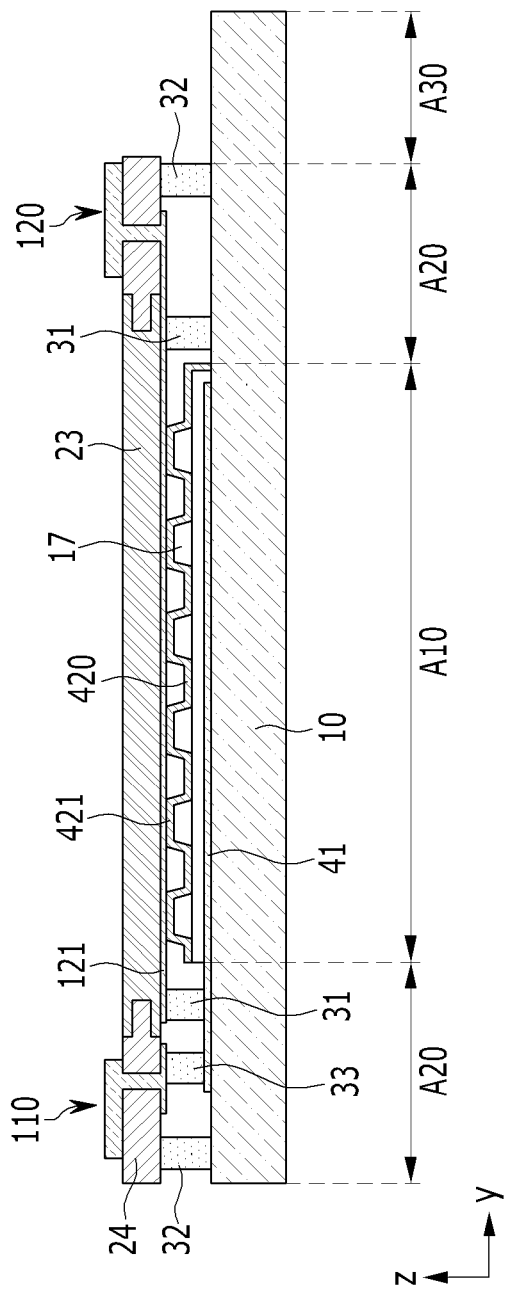
FIG. 16 is a cross-sectional view schematically illustrating another embodiment of an organic light emitting diode (OLED) display.
Figure 17:
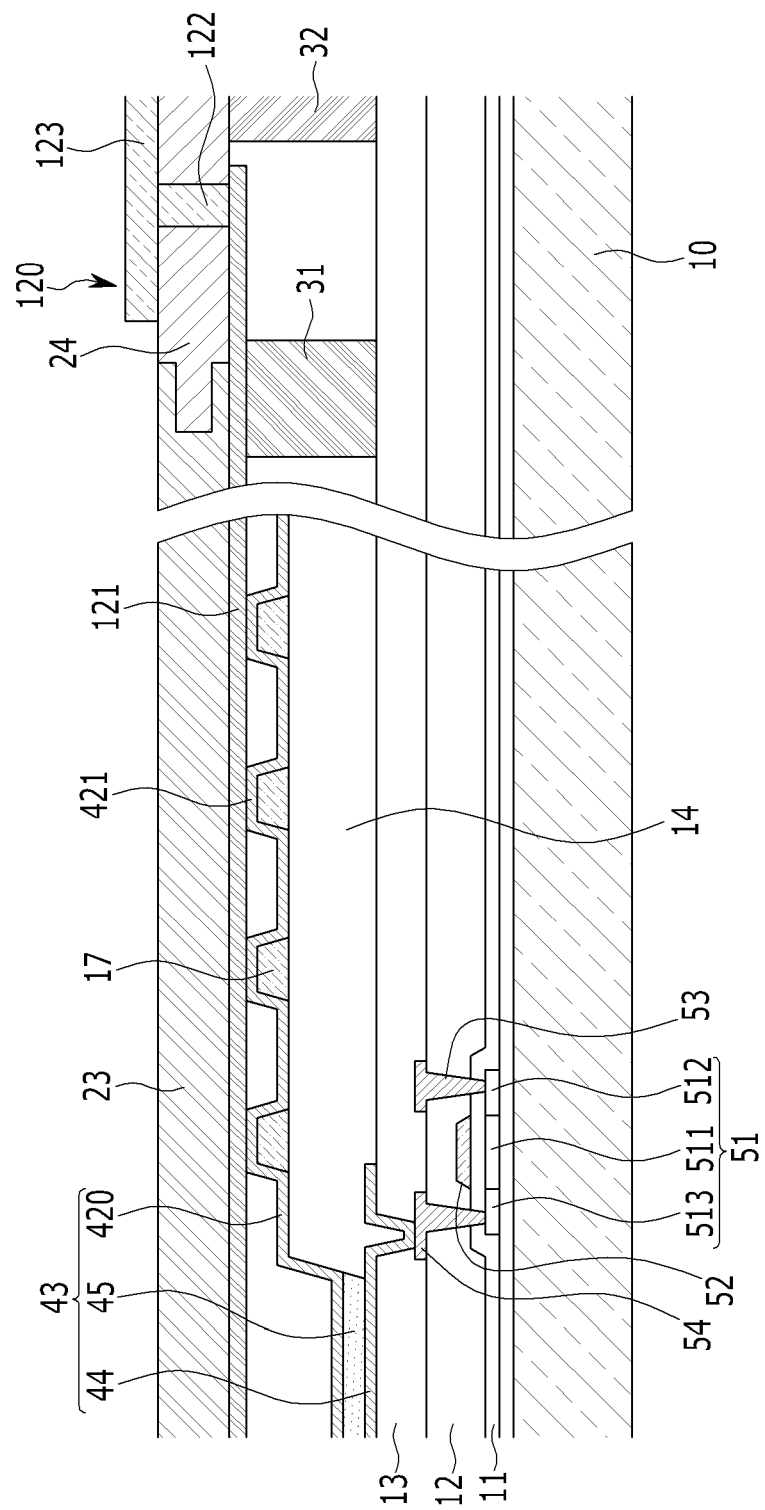
FIG. 17 is an enlarged view of the embodiment of an organic light emitting diode (OLED) display shown in FIG. 16.

FIG. 16 is a cross-sectional view schematically illustrating another embodiment of an organic light emitting diode (OLED) display. FIG. 17 is an enlarged view of the embodiment of an organic light emitting diode (OLED) display shown in FIG. 16.

Referring to FIG. 16 and FIG. 17, another embodiment of the organic light emitting diode (OLED) display 200 has a structure similar to the organic light emitting diode (OLED) display described above. In this embodiment, the second pad unit is omitted and a second inner layer 121 formed on the sealing substrate 20 contacts a common electrode 420. Like reference numerals generally denote like elements in the two embodiments.

A common electrode 420 has a protrusions and depressions structure, where a plurality of protruding portions 421 are formed. The protruding portions 421 closely contact the second inner layer 121 formed at the sealing substrate 20. Accordingly, the common electrode 420 is directly connected to the second conducting unit 120 without passing through the conductive bonding layer 33, thereby receiving an electric signal.

The protrusions and depressions structure of the common electrode 42 may be realized by a spacer 17. In some embodiments, a plurality of spacers 17 are formed on a pixel defining layer 14 and the common electrode 420 covers the plurality of spacers 17 in the display unit 40. The common electrode 420 closely contacts the second inner layer 121 and is electrically connected to the second conducting unit 120 when the substrate 10 is adhered to the sealing substrate 20 at a predetermined pressurizing condition.

Only a first pad unit is disposed at the wire and sealing area A20 in the organic light emitting diode (OLED) display 200 to apply a first electric signal to the common power line 41. The second inner layer 121 formed at the sealing substrate 20 does not include a plurality of second expansion units extending toward the second pad unit.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

<Description of symbols>

| | | | |
|---|---|---|---|
| 100, 200: | organic light emitting diode (OLED) display | 10: | substrate |
| 20: | sealing substrate | 21: | the first penetration hole |
| 22: | the second penetration hole | 23: | complex member |
| 24: | insulator | 25, 27: | resin matrix |
| 26: | carbon fiber | 28: | reinforcing fiber |
| 31: | the first bonding layer | 32: | the second bonding layer |
| 33: | conductive bonding layer | 41: | common power line |
| 42: | common electrode | 43: | organic light emitting element |
| 50: | thin film transistor | 110: | the first conducting unit |
| 120: | the second conducting unit | | |

What is claimed is:

1. A display device comprising:
    a substrate;
    a display unit formed on the substrate;
    a sealing substrate bonded to the substrate by a bonding layer surrounding the display unit, the sealing substrate comprising a complex member and an insulating member, wherein the complex member has a resin matrix and a plurality of carbon fibers, and the insulator is connected to an edge of the complex member and comprises a penetration hole;
    a metal layer disposed at one side of the sealing substrate wherein the one side faces the substrate; and
    a conductive connection unit filling in the penetration hole and contacting the metal layer,
    wherein the complex member is coupled to the insulator by tongue and groove coupling along a thickness direction of the sealing substrate, wherein the tongue and groove are top-to-bottom symmetric, and wherein the insulator has a thickness identical to that of the complex member.

2. The display device of claim 1, wherein the complex member includes first, second, third and fourth complex layers, the first and fourth complex layers having a first width, and the second and third complex layers having a second width different than the first width, and
    wherein each one of the first complex layer to the fourth complex layer comprises a resin matrix and a plurality of carbon fibers.

3. The display device of claim 2, wherein the plurality of carbon fibers are weaved to cross each other and have a single arrangement direction in each of the first through fourth complex layers.

4. The display device of claim 2, wherein:
    carbon fibers of the first complex layer and carbon fibers of the fourth complex layer are arranged in a first direction, and
    carbon fibers of the second complex layer and carbon fibers of the third complex layer are arranged in a second direction, wherein the second direction crosses the first direction.

5. The display device of claim 2, wherein the insulation member includes first, second, third and fourth insulation layers, the first and fourth insulation layers having a first width, and the second and third insulation layers having a second width different than the first width, and
    wherein each one of the first through fourth insulation layers includes a resin matrix and a plurality of reinforcing fibers.

6. The display device of claim 5, wherein the plurality of reinforcing fibers are weaved to cross each other and have a single arrangement direction in each of the first through fourth insulation layers.

7. The display device of claim 5, wherein:
    reinforcing fibers of the first insulation layer and reinforcing fibers of the fourth insulation layer are arranged in a first direction, and
    reinforcing fibers of the second insulation layer and reinforcing fibers of the third insulation layer are arranged in a second direction, wherein the second direction crosses the first direction.

8. The display device of claim 1, wherein the insulator is made of at least one of plastic, glass, and reinforcing fiber composite material, and
    wherein the reinforcing fiber comprises at least one of glass fiber and aramid fiber.

\* \* \* \* \*